United States Patent [19]

Dehganpour

[11] Patent Number: 4,751,679

[45] Date of Patent: Jun. 14, 1988

[54] GATE STRESS TEST OF A MOS MEMORY

[75] Inventor: Sam Dehganpour, Austin, Tex.

[73] Assignee: Motorola, Inc., Schaumburg, Ill.

[21] Appl. No.: 944,712

[22] Filed: Dec. 22, 1986

[51] Int. Cl.[4] .................................................. G11C 7/00
[52] U.S. Cl. ..................................... 365/201; 365/230;
371/21
[58] Field of Search .................. 365/201, 230; 371/21;
324/73 R, 158 R, 158 T

[56] References Cited

U.S. PATENT DOCUMENTS 4,527,254 7/1985 Ryan et al. ...................... 365/201 X
4,597,062 6/1986 Asano et al. ........................ 365/201

Primary Examiner—Joseph A. Popek
Attorney, Agent, or Firm—John A. Fisher; Jeffrey Van Myers; James L. Clingan, Jr.

[57] ABSTRACT

A dynamic random access memory, formed in a substrate, has an array comprised of intersecting rows and columns with memory cells at intersections thereof. Along each row is a plurality of memory cells. Each memory cell has a storage capacitor and a transfer device. The transfer device is a transistor which has gate to which is applied a voltage to select the memory cell. Each transfer device has an insulator between the its gate and the substrate. During a test mode of the memory, all of the transfer gates are subjected to a stress test of this insulator to provide an accelerated test for the integrity of this insulator.

7 Claims, 2 Drawing Sheets

GATE STRESS TEST OF A MOS MEMORY

FIELD OF THE INVENTION

The present invention relates to memories, and more particularly, to a technique for stressing gates of transistors in MOS memories.

BACKGROUND OF THE INVENTION

In MOS dynamic random access memories (DRAMs), one of the failures that is difficult to detect is defects in the dielectric between the gates of transistors and the substrate. This dielectric has most often been silicon oxide but is also other materials or combinations of materials. One gate dielectric that is used comprises a first layer of oxide on the substrate, a nitride layer on the first oxide layer, then a second oxide layer. This combination is often referred to as ONO. This dielectric is quite thin. Defects in it may be marginal and not result in a failure until after some usage. These types of defects have resulted in testing difficulties. The most widely used approach has been to accelerate the manifestation of these defects with a period of high temperature burn-in. Burn-in takes quite some time and is a costly part of the testing process. It has been recognized that another approach to accelerated testing is to use higher voltages to stress dielectrics. Some of the advantages of this approach are pointed out in U.S. Pat. No. 4,465,973, Countryman, Jr. That patent described a technique for applying a stress voltage to one of the plates of the capacitor in DRAM. One common way of making a DRAM is to have all of the capacitors have one terminal formed in a common sheet of polysilicon. Applying a stress voltage to this common electrode is useful for testing the dielectric between this common polysilicon layer and the substrate and the dielectric between this common polysilicon layer and an overlying second polysilicon layer.

Another test that is needed, however, is to test the dielectric between the second layer of polysilicon and the substrate. For each memory cell in a DRAM, there is a capacitor and a transistor coupled together. The transistor is used for transferring charge to and from the capacitor and is often referred to as the transfer device. For the case in which the first polysilicon layer is used for a common plate for the capacitors in the array, the second layer of polysilicon is used for the gates of these transfer devices. There is then a gate dielectric which is quite thin between the second layer of polysilicon and the substrate. This gate dielectric is also susceptible of having defects which do not immediately manifest a failure so that burn-in is generally required to discover these defects.

SUMMARY OF THE INVENTION

An object of the present invention is to provide an improved memory which has improved testability.

Another object of the invention is to provide a memory with an improved accelerated test capability.

Yet another object of the invention is to provide a memory with an improved high voltage accelerated gate stress test.

These and other objects are achieved dynamic random access memory having intersecting rows and columns, each row having a plurality of memory cells comprised of a transfer device and a storage device, whereby the memory cells along a row are enabled by a voltage of a first polarity and a first magnitude applied to the transfer devices of the memory cells along the row. The memory has a circuit for providing for a test of the transfer devices which comprises a plurality of coupling circuits, a decoder circuit, and a test driver circuit. Each coupling circuit is coupled to a respective row and couples a row driver signal of the first polarity and magnitude to the transfer devices of memory cells along its respective row when selected. The decoder circuit is coupled to the plurality of coupling means and selects a coupling circuit in response to an address and selects all of the coupling circuit in response to a test enable signal. The test driver circuit couples a test driver signal to the plurality of coupling circuits. The test driver signal is a voltage of the first polarity and of a magnitude greater than the first magnitude.

DESCRIPTION OF THE INVENTION

Figure 1:
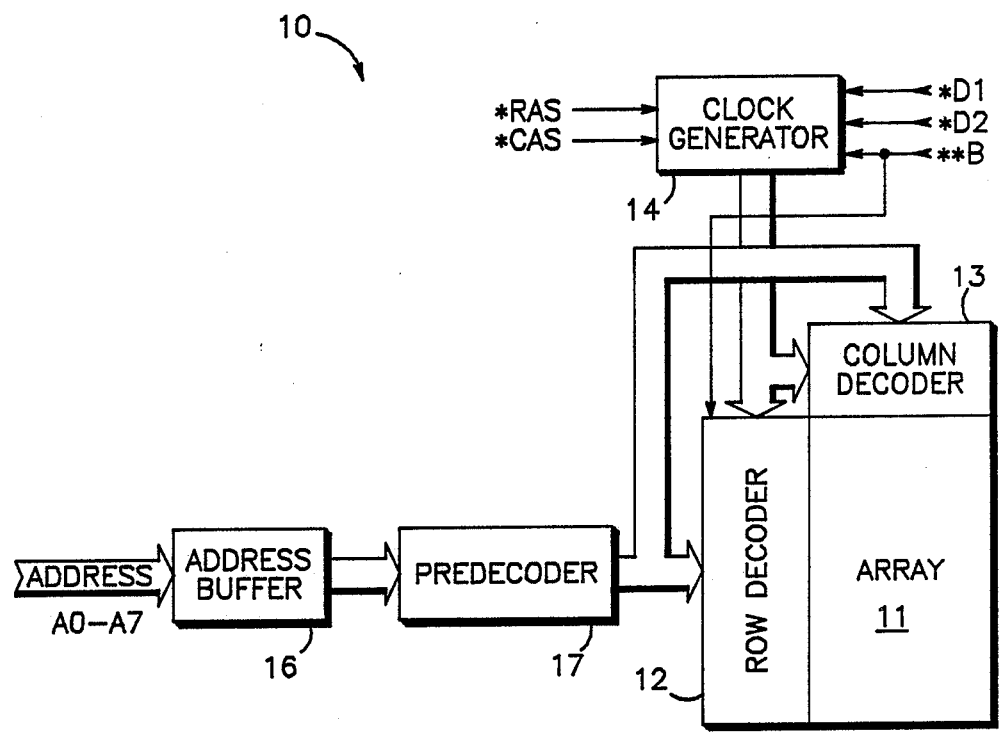
FIG. 1 is a block diagram of a memory according to a preferred embodiment of the invention.

Shown in FIG. 1 is dynamic random access memory (DRAM) 10 comprised generally of an array 11 of memory cells, a row decoder 12, a column decoder 13, a clock generator 14, an address buffer 16, and a predecoder 17. Array 11 is comprised of memory cells located at intersections of rows and columns. Address buffer 16 receives externally provided address comprised of address signals A0, A1, A2, A3, A4, A5, A6, and A7 and provides buffered complementary signals in response thereto. Predecoder 17 provides predecoded signals Z1, Z2, Z3, Z4, Z5, Z6, Z7, Z8, Z9, Z10, Z11, Z12, Z13, Z14, Z15, and Z16 in response to the complementary signals provided by address buffer 16. For any given logic combination of the address signals received, precoder 17 will provide four of predecoded signals Z1–Z16 in an active state. The active state is normally a logic high for a signal. A signal which is designated with an asterisk (*) indicates that that signal is active at a logic low.

Row decoder 12 receives predecoded signals Z1–Z16 and uses these signals to select a row. Associated with each row is a logic decoder. Each of these logic decoders receives four of predecoded signals Z1–Z16. There are 256 possible combinations of precoder signals Z1–Z16. There are 256 logic decoders in which each receives a unique combination of predecoded signals Z1–Z16. Each predecoded signal Z1–Z6 is received by one fourth of these 256 logic decoders. This is conventional predecoder operation.

Memory 10 is a DRAM in which the column and row address is multiplexed. A DRAM such as memory 10 has a data cycle in which data is either read from or written into array 11. The data cycle has two portions, an active cycle and a precharge cycle. The active cycle begins when externally provided signal *RAS becomes active by switching to a logic low. An output from array 11 will not be provided until after externally provided signal *CAS also becomes active. Clock generator 14 receives signals *RAS and *CAS and provides numerous clock signals. The beginning of the precharge cycle occurs when signals *RAS and *CAS become inactive by switching to a logic high. Column decoder 13 also receives predecoded signals Z1-Z16 for selecting a column. The timing of when row decoder 12 is responsive to the outputs of predecoders 17 and column decoder is responsive to the outputs of predecoders 17 is controlled by clock generator 14. This is conventional operation for a DRAM.

Clock generator 14 also receives externally generated voltage stress control signals **B, *D1, and *D2. In response to these signals, clock generator 14 provides internal signals which control a new voltage stress test on array 11. The stress test is to be performed when signals *RAS and *CAS are at a logic low which is the precharge cycle. Signal B has a different characteristic than normal signals for operation of memory 10. Signals B is active at a voltage below ground which is called herein a logic low-low.

Figure 2:
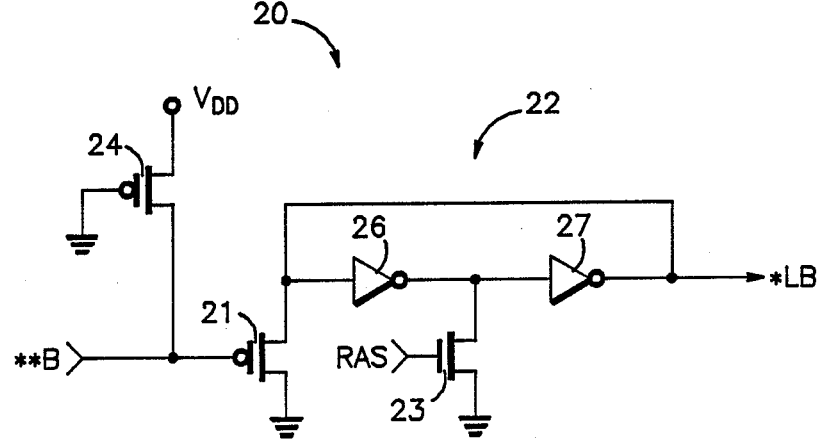
FIG. 2 is a combination circuit and logic diagram of a circuit of the memory of FIG. 1.

Shown in FIG. 2 is a detection circuit 20, which is a portion of clock circuit 14, for detecting the logic low-low state of signal B. Detection circuit 20 is comprised of a P channel transistor 21, a latch 22, an N channel transistor 23, and a P channel transistor 24. Latch 22 comprises an inverter 26, and an inverter 27. Transistor 21 has a gate for receiving signal B, a drain connected to ground, and a source. Inverter 26 has an input connected to the source of transistor 21, and an output. Inverter 27 has an input connected to the output of inverter 26, and an output for providing a latched output signal *LB. Transistor 23 has a drain connected to the input of inverter 27, a gate for receiving a clock signal RAS, and a source connected to ground. Transistor 24 has a source connected to a positive power supply terminal for receiving a positive power supply voltage of, for example, 5 volts, a gate connected to ground, and drain connected to the gate of transistor 21. Signal B must be at least a P channel threshold voltage below ground for transistor 21 to bring the input of inverter 26 to ground. Transistor 24 holds the gate of transistor 21 to a logic high is the absence of the application of signal B. When signal **B is active, latch 22 will be latched to provide signal *LB at a logic low even if signal **B is removed. Signal *LB is reset to a logic high by signal RAS switching to a logic high. Signal RAS is a signal generated by clock generator 14 in response to signal *CAS. Signal RAS is active at a logic high during the active portion of the cycle. Thus after signal **B has switched to a logic low-low, signal *LB will remain at a logic low until the next active cycle.

Figure 3:
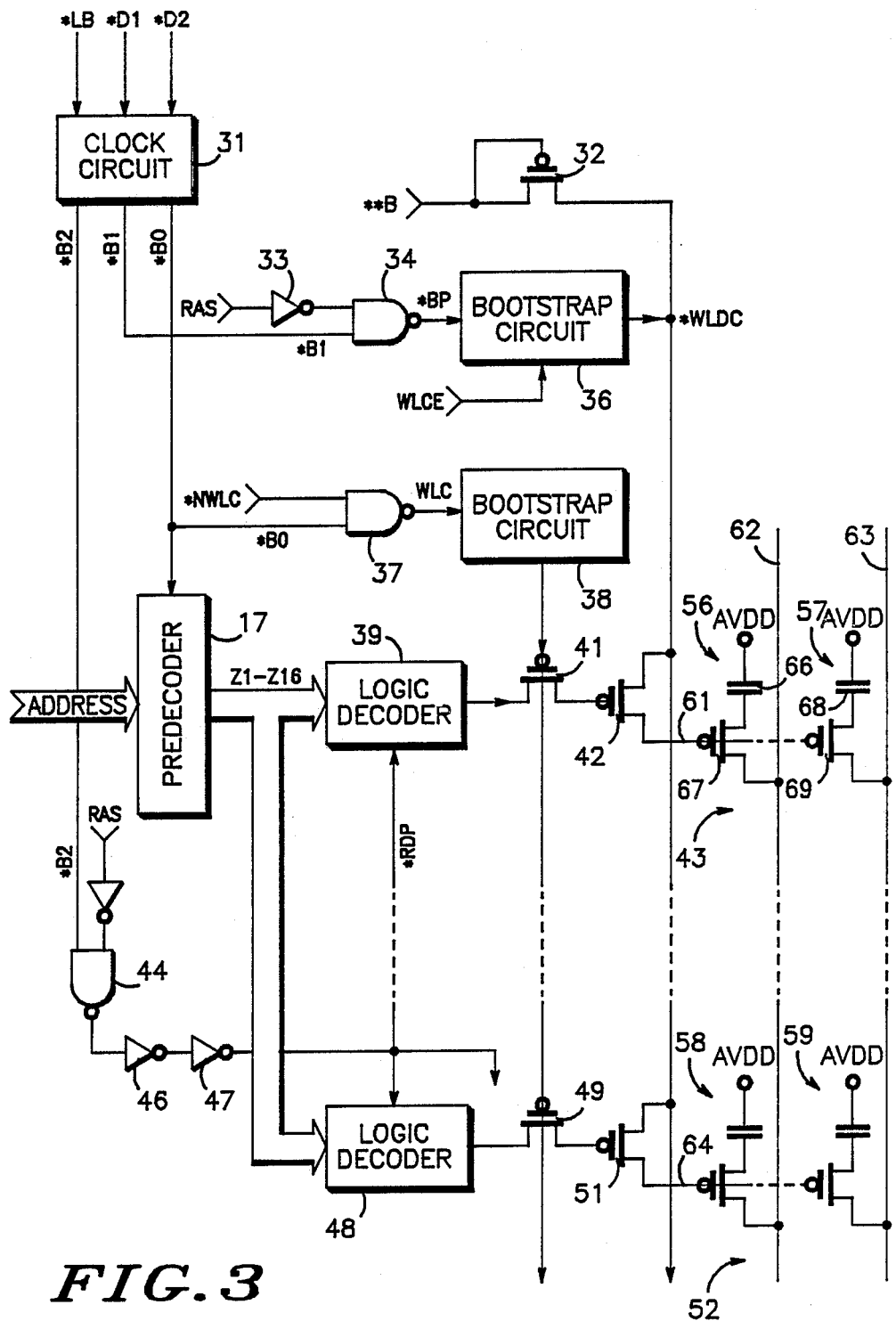
FIG. 3 is a combination logic, circuit, and block diagram of a portion of the memory of FIG. 1 according to a preferred embodiment of the invention.

Shown in FIG. 3 is a portion of memory 10 comprising a clock circuit which is a portion of clock circuit 14, a P channel transistor 32, an inverter 33, a NAND gate 34, a bootstrap circuit 36, a NAND gate 37, a bootstrap circuit 38, predecoder 17, a logic decoder 39, a P channel transistor 41, a P channel transistor 42, a row 43, a NAND gate 44, an inverter 46, an inverter 47, a logic decoder 48, a P channel transistor 49, a P channel transistor 51, and a row 52.

Clock circuit 31 has a first input for receiving signal *LB, a second input for receiving signal *D1, and a third input for receiving signal *D2, a first output for providing a signal *B0, a second output for providing a signal *B1, and a third output for providing a signal *B2. P channel transistor is a diode-connected having a gate and drain connected together to receive signal **B2, and a source. Inverter 33 has an input for receiving signal RAS, and an output. NAND gate 34 has a first input connected to the output of inverter 33, a second input for receiving signal *B1, and an output. Bootstrap circuit 36 has a first input connected to the output of NAND gate 34, a second input for receiving a word line clock enable signal, and an output connected to the source of transistor 32. The output of bootstrap circuit 36 provides a word line driver clock signal *WLDC. NAND gate 37 has a first input for receiving a normal word line coupling signal *NWLC, a second input for receiving signal *B0, and an output for providing a word line coupling signal WLC. Bootstrap circuit 38 has a first input connected to the output of NAND gate 34, and an output. Predecoder 17, in addition to receiving the buffered address signals and providing predecoded address signals in response thereto, has an input for receiving signal *B0. Logic decoder 39 has an input for receiving four of signals Z1-Z16, a second input for receiving a row decoder precharge signal *RDP, and an output. Transistor 41 has a first current electrode connected to the output of logic decoder 39, a control electrode connected to the output of bootstrap circuit 38, and a second current electrode. Transistor 41 is used in a manner which takes advantage of the bilateral nature of insulated gate field effect transistors whereby the functions of drain and source are interchangeable. Transistor 42 has a drain for receiving signal *WLDC, a gate connected to the second current electrode of transistor 41, and a source connected to row 43 at a word line 61. Logic decoder 48 has a first input for receiving four of predecoded signals Z1-Z16, a second input for receiving signal *RDP, and an output. Transistor 49 has a first current electrode connected to the output of logic decoder 48, a control electrode connected to the output of bootstrap circuit 38, and a second current electrode. Transistor 51 has a drain for receiving signal *WLDC, a gate connected to the second current electrode of transistor 49, and a source connected to row 52 at a word line 64.

Row 43 is comprised of a memory cell 56 connected to word line 61 and a bit line 62, a memory cell connected to word line 61 and a bit line 63, and other memory cells not shown which are connected to word line 61 and other bit lines not shown. Row 52 comprises a memory cell 58 connected to word line 64 and bit line 62, a memory cell 59 connected to word line 64 and bit line 63, and other memory cells not shown which are connected to word line 64 and other bit lines not shown. Memory cells 56-59 each comprise a capacitor and a P channel transistor. The capacitor stores data in the form of charge. Each of these storage capacitors has a terminal connected to an array positive power supply terminal AVDD for receiving a positive power supply voltage of, for example, 5 volts. This common terminal is formed in a first layer of polysilicon. Each of these storage capacitors also has a terminal connected to the P channel transistor of its corresponding memory cell. The P channel transistors are the transfer devices which couple charge to or from the bit line to which it is coupled. The transfer device is enabled when the word line to which it is connected is enabled. By way of example for row 43, memory cell 56 has a P channel transfer device 67 and a storage capacitor 66, and memory cell 57 has a transfer device 69 and a capacitor 68. Transfer devices 67 and 69 have gates connected to word line 61. A word line, such as word line 61, is enabled when it is a logic low. The logic low is bootstrapped so that the enabling voltage applied to a word line is a negative voltage of, for example, −2 volts. This is conventional for a DRAM array which has P channel transfer devices such as devices 67 and 69.

Signals *B0, *B1, and *B2 are generated for a stress test of the transfer devices of memory cells 56-59 and are at a logic high when the test is not run. When signals *B0, *B1, and *B2 are at a logic low, memory 10 and the portion thereof shown in FIG. 3 operates as a conventional DRAM. Signal RAS switches to a logic high to indicate that an active cycle has been initiated. Predecoder 17 provides predecoded signals to logic decoders such as logic decoders 39 and 48. One of these logic decoders provides a logic low ouput in response thereto indicating that that logic decoder has been selected. Assume, for example, that logic decoder 39 was selected so that logic decoder 39 provides a logic low output. Bootstrap circuit 38 provides a bootstrapped logic low output so that the logic low output of logic circuit 41 does not experience a threshold voltage drop in being coupled to the gate of transistor 42 via transistor 41. The outputs of the other logic decoder such as logic decoder 51 are all a logic high so that transistor 49 couples a logic high to the gate of transistor 51 in response to the logic low output of bootstrap circuit 38. The bootstrapped logic low output of circuit 38 is in response to signal *NWLC switching from a logic high to a logic low which causes signal WLC to switch to a logic high which in turn causes circuit 38 to provide the bootstrapped logic low output. The gate of transistor 42 is thus at ground potential.

Signal *NWLC then switches back to a logic high causing bootstrap circuit 38 to provide a logic high output which causes transistor 41 to become nonconductive. The gate of transistor 42 is still at ground potential. Signal *WLDC is switched by bootstrap circuit 36 to about −2 volts in response to signal WLCE switching to a logic low which causes the gate of transistor 42 to switch to a voltage several volts more negative than −2 volts by the conventional self-bootrapping effect. Transistor 42 thus couples the full negative voltage of signal *WLDC to word line 61 without causing a P channel threshold voltage drop. This is a conventional word line enabling technique for a MOS DRAM. After bootstrap circuit 38 has provided a logic high output, the word lines can no longer be responsive to the predecoder signals so that the predecoder can begin providing the column address.

After an active cycle has been completed, signal RAS switches to a logic low. This causes bootstrap circuit 36 to provide signal *WLDC at a logic high and inverter 47 to provide signal *RDP at a logic low. Logic decoders 39 and 48 respond to signal *RDP switching to a logic low by precharging all of the logic decoders such as logic decoders 39 and 48. Bootstrap circuit 36 is precharged by signal *BP switching to a logic low which is caused by signal RAS switching to a logic low. Bootstrap circuit 36 has a precharge element which is enabled in response to signal *BP switching to a logic low. Similarly the logic decoders such as logic decoders 39 and 48 each have a precharge element which is enabled in response to signal *RDP switching to a logic low.

For the operation of a gate stress test, signals *B0, *B1, and *B2 are generated by clock circuit 31 to override some of the signals used for normal operation while using much the same circuitry used for normal operation. None of signals *B0, *B1, and *B2 are generated unless signal *LB is first latched to a logic low. After signal *LB has been latched to a logic low, signals *B0 and *B2 are responsive to signal *D1, and signal *B1 is responsive to signal *D2. To begin the gate stress test after signal *LB has been latched, signal D1 switches to a logic low causing signals *B0 and *B2 to switch to a logic low. Signal **B does not need to remain at a negative voltage after signal *LB is latched to a logic low. Signal *B0 switching to a logic low causes predecoder 17 to provide all of predecoded signals Z1-Z16 at a logic high and signal WLC to switch to a logic high. Signal *B0 switching to a logic low has the same affect on signal WLC as signal *NWLC switching to a logic high during the active cycle. Bootstrap circuit 38 responds to the logic high output of NAND gate 37 by providing a bootstrapped logic low output of about −2 volts. Signal *B2 switching to a logic low causes signal *RDP to switch to a logic high. Signal *B2 switching to a logic low has the same affect on signal *RDP as does signal RAS switching to a logic high which is to disable the precharge circuits present in the logic decoders such as logic decoders 39 and 48.

With all of predecoded signals Z1-Z16 at a logic high, all of the logic decoders such as logic decoders 39 and 48, provide a logic low output. In the case of word line coupling transistors 42 and 51, the gates thereof receive the logic low output of logic decoders 39 and 48, respectively. At some point after signal **B has switched back to a logic high, signal *D1 switches back to a logic high which causes signals *B0 and *B2 to switch to a logic high. This in turn causes signal WLC to switch to a logic low which causes bootstrap circuit 38 to output a logic high. This logic high output causes word line coupling transistors such as transistors 42 and 51 to have trapped on their gates a logic low at ground potential. This is the same condition that is present on a word line coupling transistor which is coupled to a selected word line during an active cycle of DRAM 10.

After signal *D1 has switched to a logic high which then causes the gates, which are at ground potential, of the word line coupling transistors such as transistors 42 and 51 to be isolated from their corresponding logic decoders, signal *D2 is switched to a logic low which causes signal *BP to switch to a logic high. Signal *BP at a logic high disables the precharge circuit which is part of bootstrap circuit 36. This has the effect of tristating the output of bootstrap circuit 36. Signal B is then switched to the negative voltage which is chosen for the stress test which can be, for example, −10 volts. The switching of signal B to a negative voltage couples this negative voltage to the word line coupling transistors via diode-connected transistor 32. Diode-connected transistor 32 does cause there to be a P channel threshold voltage drop between signal **B and signal *WLDC.

As in operation during an active cycle, the switching of signal *WLDC from the logic high present during the precharge cycle to the negative voltage for driving a word line, causes a self-bootstrapping action on gates of word line coupling transistors which have ground potential trapped on their gates. During normal operation only one word line coupling transistor has a logic low on its gate whereas the stress test operation causes all of the word line coupling transistors to be enabled by having their gates at a logic low. When signal *WLDC switches to the negative voltage driven by signal **B, the gates of word line coupling transistors such as transistors 42 and 51, switch to a voltage which is more negative than signal *WLDC. This allows the full voltage of signal *WLDC to be coupled to the word lines such as word lines 64 and 61. Transfer device transistors 67 and 69 along word line 61 thus receive a much more negative voltage than is received during normal operation. If one or more of transistors 67 and 69 have a marginal defect, it will actually result in a failure as a result of the application of higher voltage differential. The detection of such defects is thus achieved by performance of an electrical test at a probe stage of testing instead of requiring burn-in to detect such defects. The test for such defects is thus accelerated. Not only are all of the transfer devices in all of the rows simultaneously receiving the stress test voltage of signal WLC but the word line coupling transistors are all also simultaneously receiving the stress test voltage on their gates by virtue of the self-bootstrapping effect. These gates actually experience a higher voltage differential than that of the transfer devices because of the bootstrapping effect.

Memory 10 thus has the ability to apply, simultaneously, to all of the rows, a stress test voltage which can accelerate the detection of defects. The magnitude of the stress test voltage can be varied experimentally. It is of course undesirable to apply a voltage of such a large magnitude that failures are created even when there is no defect. The polarity of the stress voltage in the present case is negative because that is the polarity of normal operation. The transfer devices normally receive a logic high 5 volt signal. To be enabled, the transfer devices receive a lower voltage to make them conductive. Thus, for enabling the transfer devices, the voltage is changed in the negative direction and the voltage for enabling thus has a negative polarity.

This test is intended for use in the probe stage of wafer testing. The application of signals **B, *D1, and *D2 is intended to be done by a tester. The integrated circuit memory can have separate probe pads for application of these signals which are externally generated by the tester. Application of these signals can also be made at existing pads which are inactive when signals *RAS and *CAS are inactive. This is particularly true for signals *D1 and *D2 which have normal logic levels. Wherever signal **B is applied, that location must be able to withstand the negative voltage which will be applied thereto.

Normal operation of DRAM 10 can be initiated at any time by withdrawing the application of signal **B and switching signal *RAS to a logic low. Switching signal *RAS to a logic low causes signal RAS to switch to a logic high which causes signal *LB to switch to a logic high. Signal *LB at a logic high forces signals *B0, *B1, and *B2 to a logic high. Depending upon the location chosen for application of signals *D1 and *D2, it may be also be necessary to withdraw application of these signals for normal operation. When signal *B0 switches back to a logic high, predecoder 17 is no longer forced to provide signals Z1-Z16 to a logic high but responds as in normal operation, and signal WLC returns to the control of signal RAS as in normal operation. When signal *B1 switches back to a logic high, signal *BP returns to the control of signal RAS as in normal operation. When signal *B2 switches back to a logic high, signal *RDP returns to the control of signal RAS as in normal operation.

I claim:

1. An integrated circuit dynamic random access memory having intersecting rows and columns, each row having a plurality of memory cells comprised of a transfer device and a storage device, whereby the memory cells along a row are enabled by a voltage, of a first polarity and a first magnitude, applied to the transfer devices of the memory cells along the row, comprising:

predecoder means for receiving an address, performing a predecode of the received address, and providing predecoded signals with respect thereto, and for providing all of the predecoded signals at a first logic state in response to receiving a predecoder set signal;

a plurality of logic decoder means coupled to the predecoder means, each logic decoder means for receiving a unique subset of the predecoded signals and for providing an output enable signal when all of the predecoded signals received thereby are at the first logic state;

a plurality of coupling means, each coupling means, coupled to a respective row, a respective logic decoder means, and a word line driver line, for coupling a signal present on the word line driver line to the transfer devices of memory cells along its respective row in response to its respective logic decoder means providing the output enable signal thereof;

word line driver means, coupled to the word line driver line, for providing the row driver signal to the word line driver line in response to a driver enable signal and for being disabled in response to a driver disable signal;

test driver means for coupling a test driver signal, provided externally from the integrated circuit, to the word line driver line;

whereby the test driver signal is applied to the transfer devices of the memory cells of all of the rows in response to the predecoder means receiving the predecoder set signal, the word line driver means receiving the driver disable signal, and the test driver means receiving the test driver signal.

2. The memory of claim 1, wherein each coupling means comprises:

a first transistor having a first current electrode coupled to the word line driver line, a second current electrode coupled to the respective row of the coupling means, and a control electrode; and a second transistor having a first current electrode coupled to the control electrode of the first transistor, a control electrode for receiving a coupling signal, and a second current electrode for receiving the output enable signal of the respective logic decoder of the coupling means.

3. The memory of claim 2, further comprising: coupling enable means for providing the coupling signal in response to the predecoder set signal.

4. The memory of claim 3, wherein the test driver means comprises a transistor having a first current electrode and a control electrode for receiving the test driver signal, and a second current electrode coupled to the word line driver line.

5. In an integrated circuit dynamic random access memory having intersecting rows and columns, each row having a plurality of memory cells comprised of a transfer device and a storage device, whereby the memory cells along a row are enabled by a voltage, of a first polarity and a first magnitude, applied to the transfer devices of the memory cells along the row, and comprising:

precoder means for receiving an address, performing a predecode of the received address, and providing predecoded signals with respect thereto;

a plurality of logic decoder means coupled to the predecoder means, each logic decoder means for receiving a unique subset of the predecoded signals and for providing an output enable signal when all of the predecoded signals received thereby are at the first logic state;

a plurality of coupling means, each coupling means, coupled to a respective row, a respective logic decoder means, and a word line driver line, for coupling a signal present on the word line driver line to the transfer devices of memory cells along its respective row in response to its respective logic decoder means providing the output enable signal thereof;

word line driver means, coupled to the word line driver line, for providing the row driver signal to the word line driver line in response to a driver enable signal;

a method comprising the steps of:
   forcing the predecoder to provide all of the predecoded signals at the first logic state;
   disabling the word line driver means; and
   applying a voltage, from a source external to the integrated circuit memory, to the word line driver line of the first polarity and of a magnitude greater than the first magnitude.

6. The method of claim 5 wherein the applied voltage is a negative voltage.

7. The method of claim 6 wherein the applied voltage is coupled to the word line driver line via a diode-connected P channel transistor.

* * * * *